United States Patent [19]
Arkin et al.

[11] Patent Number: 6,028,439
[45] Date of Patent: Feb. 22, 2000

[54] MODULAR INTEGRATED CIRCUIT TESTER WITH DISTRIBUTED SYNCHRONIZATION AND CONTROL

[75] Inventors: Brian J. Arkin, Pleasanton; Garry C. Gillette, San Jose; David Chan, San Ramon, all of Calif.

[73] Assignee: Credence Systems Corporation, Fremont, Calif.

[21] Appl. No.: 08/962,472

[22] Filed: Oct. 31, 1997

[51] Int. Cl.[7] ................................................. G01R 31/26
[52] U.S. Cl. ............................................ 324/765; 324/537
[58] Field of Search .................................... 324/537, 765, 324/73.1, 158.1

[56] References Cited

U.S. PATENT DOCUMENTS

| | | | |
|---|---|---|---|
| 4,768,195 | 8/1988 | Stoner et al. ....................... | 324/73.1 X |
| 5,130,648 | 7/1992 | Moum ................................... | 324/158.1 |
| 5,235,271 | 8/1993 | Kira ....................................... | 324/765 |
| 5,280,486 | 1/1994 | Arkin et al. ........................... | 371/29.1 |

*Primary Examiner*—Glenn W. Brown
*Attorney, Agent, or Firm*—Smith-Hill and Bedell

[57] ABSTRACT

A modular integrated circuit tester includes a set of tester modules for carrying out a sequence of tests on an integrated circuit device under test (DUT). Each module includes a memory for storing instruction sets indicating how the module is to be configured for each test of the sequence. Before the start of each test, a microcontroller in each module executes an instruction set to appropriately configure the module for the test. The microcontroller in each module thereafter sends a ready signal to a start logic circuit in each other module indicating that it is ready to perform the test. When the microcontrollers of all modules taking part in the test have signaled they are ready, the start logic circuit in each module signals its microcontroller to begin the test. The modules then carry out the test with their activities synchronized to a master clock signal. The process of configuring the modules, generating the ready signals and commencing a test is repeated for each test of the sequence.

13 Claims, 6 Drawing Sheets

MODULAR INTEGRATED CIRCUIT TESTER WITH DISTRIBUTED SYNCHRONIZATION AND CONTROL

BACKGROUND OF THE INVENTION

1. Field of the Invention

The present invention relates in general to integrated circuit testers and in particular to an integrated circuit tester formed by multiple, self-synchronizing tester modules.

2. Description of Related Art

A typical integrated circuit (IC) tester performs a digital logic test by stimulating input terminals of an integrated circuit device under test (DUT) with digital logic test signals during a succession of test cycles. The tester monitors the DUT's digital output signals during each test cycle to determine whether they are responding as expected to the stimulus. The typical IC tester includes a set of circuit boards, each including one or more tester channels. At the start of each test cycle, each tester channel receives input control data defining an action or actions to be taken at a DUT terminal during the test cycle. A test action may include changing the state of a test signal at a particular time or times during the test cycle or ascertaining whether the DUT output signal is of a particular state at some particular time during the test cycle. In early testers a large central pattern generator produced input data for each tester channel at the start of each test cycle. The data was delivered concurrently from the pattern generator to all tester boards via a large star bus. However, as the number of DUT terminals increased, the centralized pattern generation architecture became impractical in part because the star bus needed to deliver the data to the tester channels became too large.

IC testers now typically distribute the pattern generation function, with each tester board including its own pattern generator. A typical pattern generator includes a pattern memory storing at each address data that is to be provided to one or more tester channel(s) for a corresponding cycle of the test. At the start of each test cycle a sequencer increments the pattern memory's address so that the pattern memory reads out the control data for that cycle to the tester channel(s). To program the tester boards to carry out a test, a central host computer successively writes the data into the pattern memory of each tester board via a high-speed parallel data bus. The host also writes configuration data into various registers within each board for controlling various test parameters such as, for example, the logic levels employed by the test signals. The host then transmits a START signal concurrently to sequencers in all pattern generators so that they begin addressing the pattern memories concurrently. Thereafter the sequencers, all clocked concurrently by a centralized clock source, synchronize their counts so that all pattern memories read out data for the same test cycle at the same time.

Many integrated circuit testers can perform other types of tests on an integrated circuit. For example, in a leakage current pass/fail test a known voltage is supplied to a DUT terminal through a resistor. A voltage produced across the resistor by current in the DUT terminal is compared to reference voltages to determine whether the current in the DUT terminal is within a specified range. In a parametric leakage current measurement test, a tester measures the actual value of leakage current at a DUT. Often several different types of tests are performed in sequence on a DUT. Before each test of the sequence, the host computer must send new data to the tester boards to reconfigure them for the test. Often the amount of time the host requires to reconfigure all modules before each test of a sequence greatly exceeds the amount of time required to actually perform the test. A high-speed computer bus connection between the host and the modules is needed to reduce overall testing time, particularly when the host must reprogram the modules after each test. To reduce data transmission time between tests, host computers in some testers compress the pattern data before sending it to the various tester boards. In these testers each tester board is provided with processors for decompressing the pattern data either before the test begins or as the test progresses. Since pattern data is often highly compressible, the amount of time the host requires to send data to the circuit boards can be greatly reduced by compressing the data. Nonetheless, the data transmission time between tests can remain a significant portion of the time a tester requires to perform a sequence of tests on a DUT.

A typical large integrated circuit tester includes a test head, a structure that provides the physical contact between tester electronics and the IC. A test head can be mounted on an IC handler, a machine that sequentially delivers ICs to the test head. The tester circuit boards can be mounted on the test head or in a nearby chassis. Because the host computer is connected to the tester boards through a high speed parallel computer bus, and since such a bus must be relatively short, the host computer must be located near the tester boards.

It would be desirable to allow a single host computer to control tester boards of several separate IC testers. However there are several reasons why prior art technology makes this unfeasible. First, since all of the channels of an integrated circuit tester operate synchronously, tests on separate IC's must start at the same time, stop at the same time, and have a similar test period length. Thus it would be difficult to program two groups of tester boards to carry out different tests at the same time. Prior art testers can test more than one DUT at the same time, but all DUTs being tested must be similar and must be tested in the same way. Also since the tester boards must be connected to the host via a short parallel computer bus, it is not practical to separate groups of tester boards so that they can be on or near test heads mounted on separate handlers somewhat distant from one another. The limitation on computer bus length also places a limitation on the number of tester boards that can be connected to the bus.

The demands made on the host by a large IC tester can also make it difficult for the host to control a large number of tester boards. In an integrated circuit tester capable of carrying out more than one type of test on a DUT, the host computer must supply considerable amount of data to each tester board before each test. This activity can keep the host quite busy since the host typically can only configure one board at a time. Bandwidth limitations on the bus connecting the host to the tester boards provide a practical limit to the number of tester boards that the host can reprogram within a reasonable time between tests.

What is needed is a modular integrated circuit tester architecture that allows a single host to control multiple tester modules, wherein modules can operate either independently or in groups to perform differing test sequences on separate sets of integrated circuits, wherein modules may be physically separated from the host by relatively large distances, and wherein the host does not have to reconfigure each module between each test.

SUMMARY OF THE INVENTION

An integrated circuit tester in accordance with the present invention includes a host computer and a set of tester modules for carrying out a sequence of tests on an integrated circuit device under test (DUT). Each tester module carries out all test activities at a subset of the terminals of the DUT.

In accordance with one aspect of the invention, the host computer transmits a separate set of instructions to a controller within each module indicating how the module controller is to configure the module for each test of the sequence and indicating how the controller is to program various module components to carry out the sequence of activities for each test. The module controllers load the instructions into program memories within the modules and then begin executing them, thereby causing the modules to carry out the sequence of tests.

In accordance with another aspect of the invention, the module controllers, after configuring the modules for a test, synchronize the start of the test without supervision from the host. The instructions the host provides to each module tell the module controller to initially configure its module for a first test of the sequence and then to assert an output READY signal. The READY signal produced by each module controller is sent to all other modules. When controllers of all modules that are to take part in the test have asserted their output READY signals, each module begins carrying out the test, with test activities of the separate modules being synchronized to a master clock signal. At the conclusion of the first test of the sequence, each module controller reconfigures its module for a next test of the sequence and re-asserts its output READY signal. When all modules that are to take part in the second test have asserted their output READY signals, the modules begin the second test. This process continues for each test of the sequence, with each module controller independently configuring its module before the start of each test and asserting its output READY signal, and when all modules are ready, each module thereafter carrying out its part of the test.

In accordance with yet another aspect of the invention, the host may organize the modules into separate working groups for carrying out tests on separate DUTs independently by programming each module to respond only to the subset of their input READY signal that are produced by the modules of its working group. This enables separate working group of modules to separately synchronize test starts and to conduct tests independently.

In accordance with a further aspect of the invention, the modules are linked to the host computer through a network, suitably an Ethernet network, and communicate with the host computer through using conventional network protocol. Since a serial Ethernet bus can be much longer than a high-speed parallel computer bus, groups of modules can be located more distant from the host and from one another. Thus one host can control separate working groups of modules even when working groups are located far from the host. Although it may take longer for the host to send data to the modules via an Ethernet network than through a high speed parallel computer bus, once the host has sent the instructions to the modules defining the sequence of tests to be performed on each of a large number of DUTs, it only has to send those instructions once. The host does not have to reconfigure the modules or communicate with them in any way between each test of the sequence. Although the host may communicate with the local modules after each test sequence is performed on each DUT in order to acquire test results, test results normally involve only a relatively small amount of data that can be quickly transported via the Ethernet connection while a DUT handler is moving a next DUT to be tested into the tester.

It is accordingly an object of the invention to provide a modular integrated circuit tester architecture that allows a single host to control multiple tester modules, wherein modules can operate either independently or in independent working groups to perform test sequences on one or more differing integrated circuits, wherein modules may be physically separated from the host by relatively large distances, and wherein the host is not required to reconfigure or otherwise communicate with each module between each test of a sequence of tests to be performed on a DUT.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENTS

Tester Architecture

Figure 1:
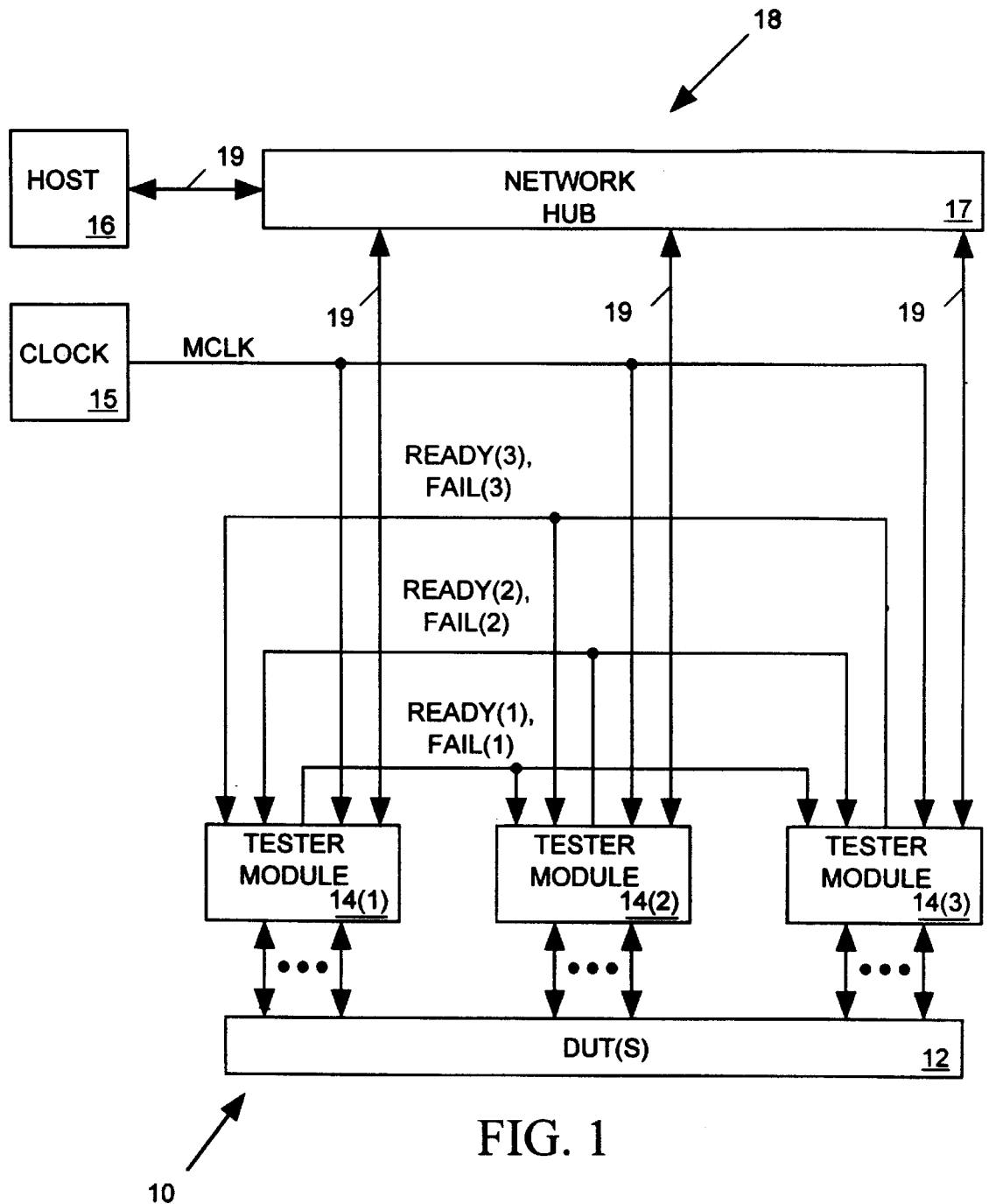
FIG. 1 illustrates a modular integrated circuit tester in accordance with the present invention.

FIG. 1 illustrates a modular integrated circuit tester 10 in accordance with the present invention for performing a sequence of tests on one or more integrated circuit devices under test (DUT) 12. Tester 10 includes a set of tester modules 14(1)–(3), each of which conducts all test activities at a corresponding set of terminals of DUT 12 during each test. Although tester 10 is illustrated in FIG. 1 as including only three tester modules 14(1)–14(3), tester 10 may be easily expanded to include a larger number of tester modules. In the preferred embodiment of the invention, the sequence of tests may include one or more digital logic tests, a leakage current pass/fail test and/or a parametric leakage current measurement test.

In performing a digital logic test on DUT 12, each tester module 14 may provide logic test signals up to 48 DUT 12 terminals or may monitor output signals DUT 12 produces at one or more of those DUT terminals to determine whether DUT 12 is responding as expected to the test signals. During a digital logic test, activities of the various tester modules 14 are synchronized to a centrally generated master clock signal MCLK produced by a clock signal source 15. In performing a leakage current pass/fail test, each tester module 14 compares a voltage produced across a resistor by current through the DUT terminal to reference voltages to determine whether the current at the DUT terminal is within an acceptable range. In a parametric leakage current test, a tester module 14 measures the leakage current in the DUT terminal.

Tester 10 also includes a host computer 16 connected to tester modules 14(1)–14(3) through a conventional network 18, suitably an Ethernet network including a conventional network hub 17 and serial network buses 19. Host 16 receives input instructions from a user defining each module's role in a sequence of tests to be carried out and forwards those instructions to modules 14 via network 18 using conventional Ethernet protocol. The instructions indicate an order in which the tests are to be performed, indicate how the module is to be configured to carry out each test of the sequence, and indicate the sequence of activities that are to be carried out during each test. For a digital logic test the instructions indicate when test signals supplied to DUT 12 are to change state, indicate when the module is to sample a DUT output signal, and indicate an expected state of each DUT output signal sample. For a leakage current pass/fail test or a parametric leakage current measurement test, the instructions indicate which DUT terminals are to be tested, and test voltages to be applied to those DUT terminals. The leakage current pass/fail test instructions also include data defining an acceptable range of expected leakage current.

After sending the instructions to modules 14, host 16 broadcasts a "start" message to the module controllers in all modules 14(1)–14(3) via network 18. Each module controller responds to the start message by executing a main program included in the instructions. The main program tells the module controller to set up its module 14 for the first test of the sequence based on a set of setup instructions host 16 has provided for that. Thereafter the main program tells the module controller of each module 14(1)–14(3) to send a corresponding ready signal READY(1)–READY(3) to the other modules. A start logic circuit within each module receives all of the READY(1)–READY(3) signals and sends a PRESTART signal to the local module controller when all of the READY(1)–READY(3) signals from modules involved in the test have been asserted. The module controller within each module responds to the PRESTART signal by signaling the module to begin the first test of the sequence on the edge of a next MCLK signal. The module controller thereupon stops executing the master instructions and waits for an END message from the module that the test has been completed.

As modules 14 carry out the test, their activities are synchronized to the MCLK signal. On completing the first test, each module 14 sends an END signal its local module controller. Each module controller responds to the END signal by resuming its execution of the main instructions. The main instructors tell the module controller to configure its module 14 for a next test of the sequence and to thereafter send its output READY signal to the other modules and wait for a PRESTART signal before signaling the module to start the second test. Each module controller then again waits for the END signal from its own module 14 indicating that the second test is complete.

Each module controller repeats for each test of the sequence the process of setting the module up for the test, sending a READY signal to the other modules, waiting for a PRESTART signal, signaling the module to start the test, and then waiting for the END signal. When the last test of the sequence is complete, the DUT having passed all tests, the main program of one of modules 14 tells it to send a "DUT pass" message to host 16 via network 18. The module controllers then do nothing until receiving a message from host 16. Host 16 may respond to the DUT pass message, for example, by signaling DUT handling equipment which moves DUTs in and out of tester 10 to remove DUT 12 from tester 10 and replace it with a next DUT to be tested. If one of the tests was a parametric test or other test of the type which produces data as a test result, host 16 may also acquire the test result data from the controllers of the appropriate modules via network 18. Once the next DUT is in place and ready to be tested, host 16 may send another start message to the controller of each module 14 via network 18 telling each controller to began executing the main program once again, thereby initiating the test sequence for the next DUT.

If during any test of the sequence, any module 14(1)–14(3) detects that DUT 12 is not behaving as expected, it sends an output fail signal FAIL(1)–FAIL(3) to the other modules 14. Each module 14 includes a programmable fail logic circuit for monitoring all of the FAIL(1)–FAIL(3) signals and generating a DUT_FAIL signal when any module involved in the test has generated a FAIL(1)–FAIL(3) signal. As described below any of modules 14(1)–14(3) may respond to its local DUT_FAIL signal by sending a "DUT fail" message to host 16 via network 18 telling it that DUT 12 is defective. All modules may then halt further test activities and wait for a next message from host 16 via network 18. Host 16 may, for example, respond to the DUT fail message by signaling a DUT handler to replace the defective DUT 12 with a next DUT to be tested and thereafter sending a start message to the controller of each module 14 telling it to begin re-executing its main program, thereby restarting the test sequence for the next DUT.

Thus host computer 16, after sending instructions defining a test sequence to each of several modules 14, and sending a start message to each module controller takes no further part in test activities until it receives a message that the DUT has passed or failed the test sequence. The controllers within modules 14 configure the modules before each test of the sequence and synchronize the start of the each test without further communication with host 16.

This modular architecture if tester 10, with its decentralized configuration and synchronization capability, has several advantages over a conventional integrated circuit tester in which a single host computer directly configures all tester modules before each test of a sequence of tests to be performed on a DUT. In a conventional tester, the host may have to send large amounts of configuration data to the module before each test. To minimize the amount of time required to transfer this data to the modules, a host computer of a prior art system must communicate with the modules through a large, high speed parallel computer bus. Such a parallel bus is expensive, takes up space, and must be relatively short in order to be operated at high speeds. Since the local instruction processors within modules 14 of tester 10 of FIG. 1, rather than host 16, handle module set up between tests, a high speed connection between host 16 and modules 14 is not necessary. Of course host 16 must initially send a large amount of data to all of the modules via network 18 in order to define the sequence of tests to be performed. But since it only has to do that once before the first DUT is tested, programming data transfer time is not a significant portion of overall test time, particularly when many DUTs are to be tested. For example, when tester 10 is used in a DUT production facility, host 16 may not have to program the modules again until the DUTs become obsolete and are no longer manufactured. Host computer 16 must, of course, communicate briefly with modules 14 after each DUT has been tested to acquire test results and to tell the modules when the next DUT is in place and ready to be tested, but these actions require only a relatively small amount of data to be transferred via network 18.

Also if the instruction memory in modules 14 is large enough, modules 14 may instructions for testing more than one type of DUT. The start message host 16 sends to the module simply indicates the instruction memory address of the first instruction of the particular main program that is to be used for testing the next DUT to be tested. Thus modules 14 can be programmed to test many different types of DUTs and can switch from testing one type of DUT to another at any time without need for new programming data input from host 16.

Finally, the modular tester architecture of FIG. 1 allows the tester to be easily expanded and flexibly configured. Since host 16 has relatively little to do once the modules are programmed, a single host 16 can control several groups of modules, with each group acting as an independent tester. Since the modules are connected to the host through Ethernet network 18, each group of modules may physically separated from the others by a considerable distance, as for example when they are mounted on separate IC handlers. The flexible synchronization system thus allows the modules to be organized into a set of independent testers all controlled by a single host. Such easy and flexible system expansion and configuration is not possible with conventional tester architecture due to the high processing demands on the host and due to the limitations on distance between host and tester modules when interconnected by a high-speed parallel bus.

Tester Module Architecture

Figure 2:
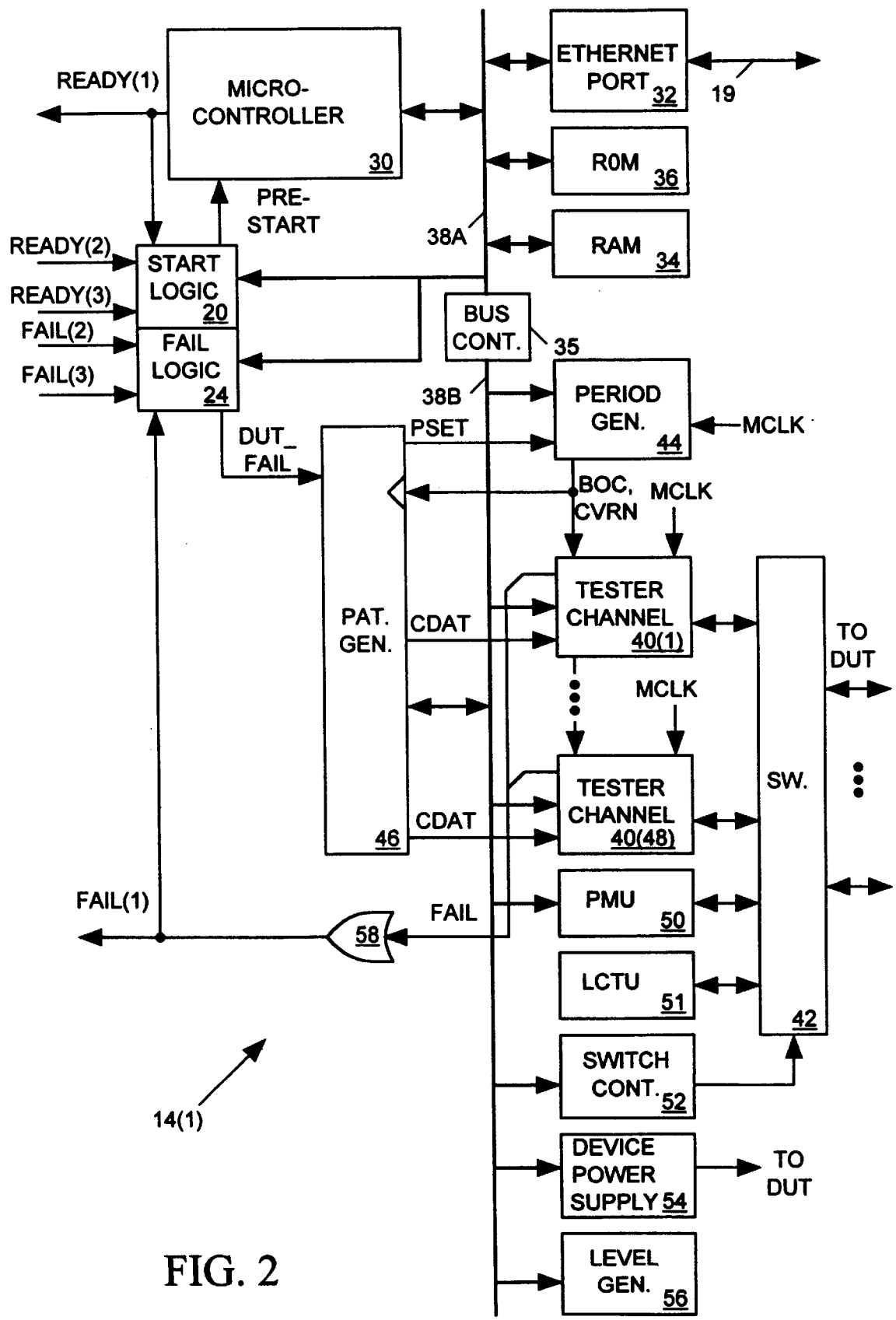
FIG. 2 illustrates a typical tester module of FIG. 1 in more detailed block diagram form.

FIG. 2 illustrates tester module 14(1) of FIG. 1 in more detailed block diagram form. The other tester modules 14 are similar. Tester 14(1) includes local microcontroller 30, suitably an Intel model i960 microcontroller, communicating with host 16 of FIG. 1 through an Ethernet port 32 and Ethernet bus 19. Microcontroller 30 accesses Ethernet port 32, a RAM 34 and a ROM 36 through a conventional parallel computer bus 38A. ROM 36 stores subroutines which enable microcontroller 30 to communicate with host 16 and to receive and begin executing instructions from host 16. As it receives instructions from host 16, microcontroller 30 writes them into RAM 34.

A start logic circuit 20 receives all of the READY(1) –READY(3) signals produced by the modules and supplies a PRESTART signal to microcontroller 30 when it detects each of a particular subset of READY(1)–READY(3) signals have been asserted. In effect, start logic circuit 20 functions as an AND gate combining READY signals to produce the output PRESTART signal. Similarly a fail logic circuit 24 receives all of the FAIL(1)–FAIL(3) signals and acts as an OR gate to generate a DUT_FAIL signal when it detects that any one of a particular subset of FAIL(1)–FAIL(3) signals have been asserted. The start and fail logic circuits 20 and 24 may be implemented by conventional programmable logic circuits that may be programmed by data supplied to them via bus 38A. The instructions host computer 16 provides to module 14(1) tell microcontroller 30 how to program start and fail logic circuits 20 and 24. In particular, the programming instructions tell the start and fail logic circuits 20 and 24 which subset of READY or FAIL signals they are to logically AND or OR.

Modules 14(1)–14(3) of FIG. 1 may be organized into separate working groups, each working group acting as an independent tester. This is useful when separate working groups are to independently test separate DUTs. For example separate working groups may be serviced by separate DUT handlers, or separate working groups serviced by the same DUT handler may concurrently test separate DUTs. The programming of logic circuits 20 and 24 in effect assigns module 14(1) to a particular module working group. For example if module 14(1) is to operate independently from all other modules, then its start and fail logic circuits 20 and 24 are programmed to respond only to the FAIL(1) and READY(1) signals. In such case the working group to which module 14(1) is assigned has only one module, itself. As another example, when module 14(1) is to be assigned to a working group including all three modules 14(1)–14(3), then start and fail logic circuits 20 and 24 are programmed to AND or OR all three READY(1)–READY(3) and FAIL (1)–FAIL(3) signals.

A conventional bus controller 35 links bus 38A to another bus 38B. Bus controller 35 normally isolates bus 38A from bus 38B so that each bus can operate independently. However bus controller 35 allows devices connected to bus 38A to send data to devices connected to bus 38B, and vice versa, when necessary. Tester module 14(1) includes a set of 48 tester channels 40(1)–40(48) linked to bus 38B. Each tester module 14(1) carries out test activities at a separate terminal of DUT 12 of FIG. 1 during digital logic tests. A switch circuit 42 selectively connects each channel to a corresponding DUT terminal. A digital logic test is organized into a set of successive test cycles, and input channel data (CDAT) supplied to each tester channel 40(1)–40(48) at the start of each test cycle tells the channel how and when its output test signal is to change state during the test cycle, when to sample a DUT output signal during the test cycle and what logic state the sampled DUT output is expected to have. Each channel 40(1)–40(48) produces an output FAIL signal when it detects that a DUT output signal fails to exhibit an expected state during any cycle of the test. The FAIL signal output of each channel 40(1)–40(48) are ORed by an OR gate 58 to produce the FAIL(1) signal.

Tester channels 40(1)–40(48) are synchronous circuits clocked by the MCLK signal from clock source 15 of FIG. 1. A period generator 44, also clocked by the MCLK signal, produces output signals BOC and CVRN indicating when each test cycle begins. The duration of each test period is determined by input data PSET supplied to period generator 44 just before the start of each period. Period generator 44 supplies the BOC and CVRN signals to each tester channel 40(1)–40(48) to synchronize the tester channels 40(1)–40 (48) during a digital logic test. Before each cycle of a digital logic test, a pattern generator 46 within tester module 14(1) supplies the CDAT input to each channel 40(1)–40(48) and supplies the PSET input data to period generator 44. The BOC output signal from period generator 44 tells pattern generator 46 when to supply the PSET and CDAT values for a next test period.

Tester module 14(1) also includes a conventional parametric measurement unit (PMU) 50 linked to DUT 12 through switch 42, for measuring leakage current at a terminal of DUT 12. A leakage current test unit (LCTU) 51 produces test signals during a pass/fail leakage current test on DUT 12. Module 14(1) also includes a controller 52 for switch 42, a power supply 54 for providing power to DUT 12, and a reference level generator 56 for supplying reference voltages to tester channels 40(1)–40(48) and LCTU 51. Channels 40(1)–40(48) use the reference voltages as standards when setting the logic levels of the test signals they supply to DUT 12 and when determining the logic levels of the DUT signals they monitor.

As it executes the setup instructions stored in RAM 34 for a test to be performed, microcontroller 30 generates data for controlling activities of various other components of module 14(1) and writes them into addressable memories or registers within those components via computer buses 38A and 38B. The data supplied to pattern generator 46 defines the output PSET and CDAT sequence it is to produce and supply to period generator 34 and channels 40(1)–40(48) during digital logic and leakage current pass/fail tests. Microcontroller 30 sends data to period generator 44 telling it how to decode its PSET data input from pattern generator 46. Since the PSET data is only 4-bits wide it can select from among only 16 different test cycle lengths. However since period generator 44 is capable of establishing any of a very large number of test cycle lengths, the programming data microcontroller 30 may provide to period generator before each test assigns each of the 16 possible PSET values to a particular period length. Thus any of up to 16 different test cycle lengths can be selected during a given test.

Microcontroller 30 may also write control data into tester channels 40(1)–40(48) before each test to tell them how to respond to various values of the CDAT input from pattern generator 46. As mentioned above, pattern generator 46 supplies that CDAT input to each channel 40(1)–40(48) at the start of each test cycle to tell the channel what to do during the cycle. The number of different types of activities (combinations of actions and timing) each tester channel 40(1)–40(48) can carry out during a test cycle is much larger than can be permanently assigned to a unique CDAT value which has only a limited number of bits. However the number of different combinations of actions and timing actually needed during a given test is typically relatively small. Thus the control data that microcontroller 30 supplies to each tester channel before the start of a test correlates each pattern generator output CDAT value with a particular combination of action and timing that will be used during the test. Microcontroller 30 may also supply input control data via buses 38A/38B to PMU 50, switch controller 52, device power supply 54 and/or reference level generator 56 to properly adjust their operating parameters or control settings before each test.

Pattern Generator

Figure 3:
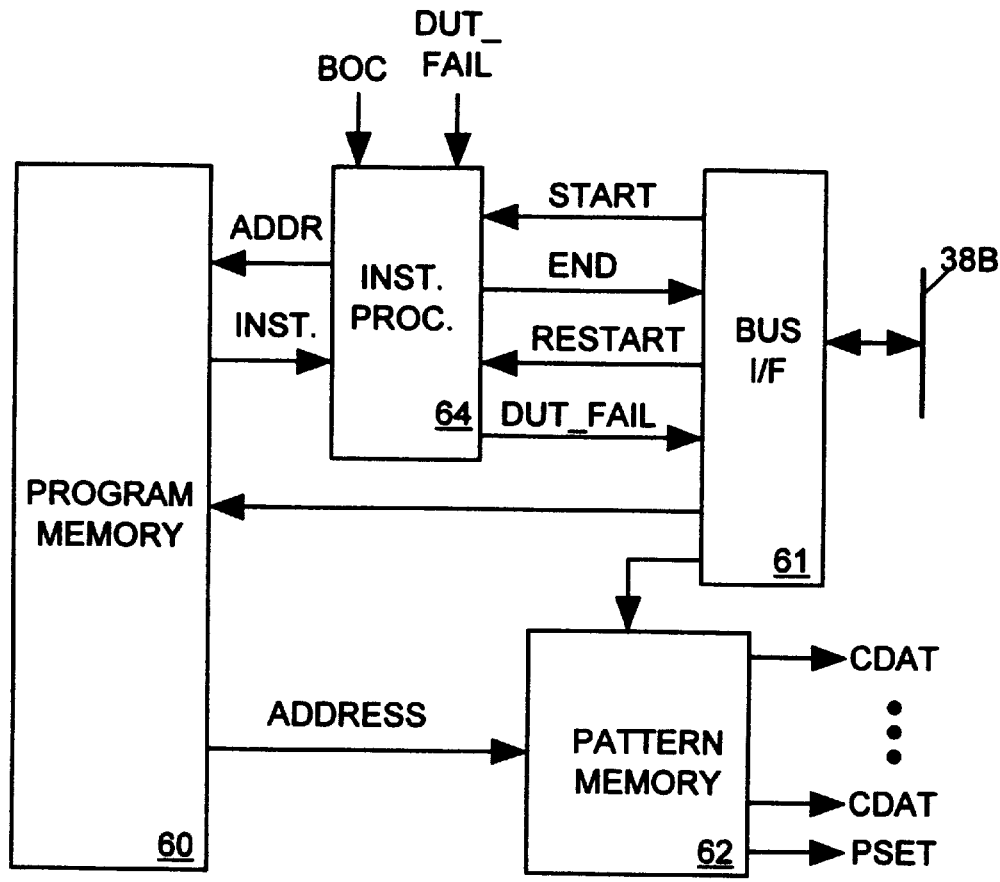
FIG. 3 illustrates the pattern generator of FIG. 2 in more detailed block diagram form.

FIG. 3 illustrates pattern generator 46 of FIG. 2 in more detailed block diagram form. During the set up process local microcontroller 30 of FIG. 2 supplies data to pattern generator 46 by writing it via bus 38B and a conventional bus interface circuit 61 into a program memory 60 and into a pattern memory 62. Pattern memory 62 may store at any given address the CDAT and PSET data that is to be provided to period generator 44 and tester channels 40(1)–40(48) for one test cycle. Program memory 60 supplies an address to pattern memory 62 during a test so that pattern memory 62 reads out the appropriate CDAT and PSET data for each test cycle. In addition to storing a pattern memory address at each location, program memory 60 also stores an instruction for an instruction processor 64 that is clocked at the start of each test cycle by the BOC signal from period generator 44 of FIG. 2.

When microcontroller 30 of FIG. 2 receives a PRESTART signals from start logic circuit 60, its sends a start message to bus interface circuit 61. Bus interface circuit 61 responds by sending a START signal to instruction processor 64. Upon receiving the START signal instruction processor 64 addresses the first storage location in program memory 60 so that memory 60 supplies a first address to pattern memory 62 and provides a first instruction to processor 64. Pattern memory 62 then reads out the CDAT and PSET data for the first test cycle. The first instruction INST provided to processor 64 tells it how to produce a next address (ADDR) to program memory 60 on receipt of the next BOC signal pulse. Thereafter program memory 60 reads out a new address (ADDRESS) to pattern memory 62 and supplies a next instruction INST to processor 64. The process continues until instruction processor 64 receives a halt instruction from program memory 60 indicating the test is at an end. The halt instruction causes processor 64 to send an END signal to bus interface circuit 61 and to wait for another signal from bus interface circuit 61. Interface circuit 61 responds to the END signal by sending and end message to microcontroller 30.

At that point, microcontroller 30 of FIG. 2 reconfigures the tester for a next test any may, if necessary provide new data to program memory 60 of pattern memory 62. However if the next test involves pattern generator 46, and program memory 60 and pattern memory 62 are large enough to hold data for both the first and second tests, then microcontroller 30 may not need to send any new data to memories 60 or 62.

After setting up the module for the next test and receiving a PRESTART signal, microcontroller 30 may, if the next test involves pattern generator 46, send either a start or a restart message to bus interface 61 causing the bus interface circuit to send either a START or RESTART signal to instruction processor 64. The START signal tells instruction processor to address the first storage location of program memory 60 and is used when microcontroller 30 has written new program data into program memory 60. The RESTART signal is used when no new data has been written into program memory 60 and instruction processor 64 is to resume addressing program memory 60 at the next address following that of the last instruction for the previous test.

When fail logic circuit 24 of FIG. 2 generates a DUT_FAIL signal during a test, it sends that signal as an interrupt to instruction processor 64 of the pattern generator. Instruction processor 64 then executes an interrupt routine stored in program memory 60. That interrupt routine may, for example, tell instruction processor to send a DUT_FAIL signal to bus interface 61 and then then halt further operation until receiving either a START or RESTART signal. Bus interface circuit 61 responds to the DUT_FAIL signal by sending a DUT fail message to microcontroller 30. Microcontroller 30 in turn sends a DUT fail message to host 16 of FIG. 1. The host can then put a new DUT into the test head and send a start message to microcontroller 30 of each module to restart the test.

Period Generator

Figure 4:
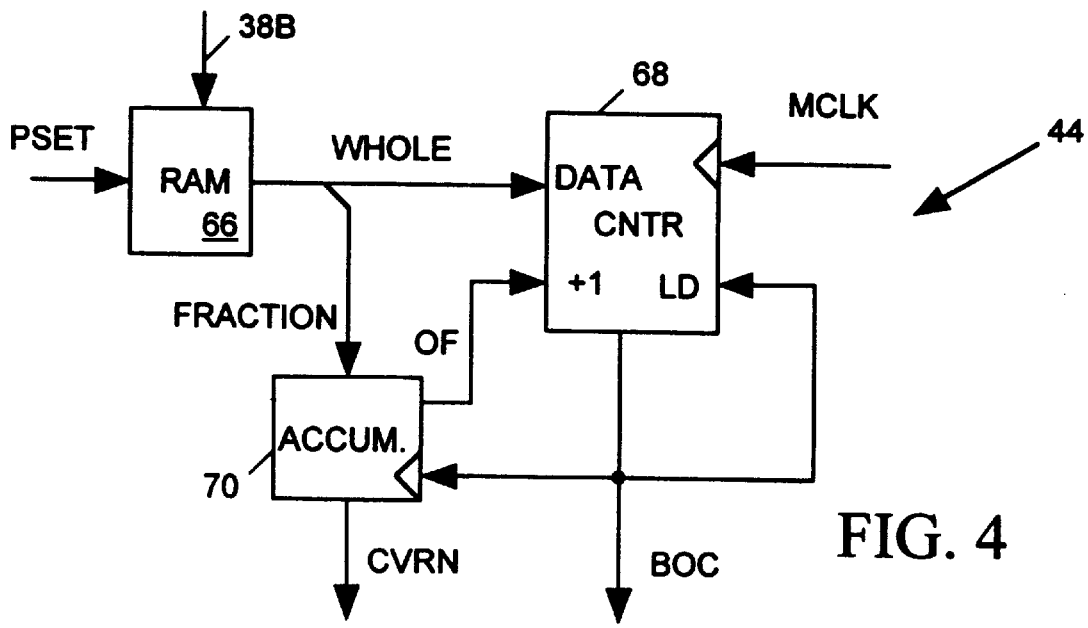
FIG. 4 illustrates the period generator of FIG. 2 in more detailed block diagram form.

FIG. 4 illustrates period generator 44 of FIG. 2 in more detailed block diagram form. Period generator 44 responds to the PSET output of pattern generator 46 by producing an output BOC signal and an output CVRN data value. The BOC signal indicates a last MCLK pulse preceding a start of a next test cycle while the CVRN data indicates a fractional portion of one MCLK cycle after that MCLK pulse that the next test cycle actually begins.

A main test cycle spans a whole and fractional number of master clock MCLK cycles. The PSET output of pattern generator 46 of FIG. 2 addresses a RAM 66 as it executes the setup instructions. RAM 66, loaded with data from microcontroller 30 via bus 38B, acts as a lookup table to convert each of the 16 possible PSET values to data defining a test cycle length. The data output of RAM 66 of FIG. 1 includes WHOLE and FRACTION values respectively indicating the whole and fractional portions of the period of the next main test cycle. On the trailing edge of next BOC signal pulse, the WHOLE data is loaded into a counter 68 and the FRACTION value is accumulated by an accumulator 70. Counter 68 then begins counting MCLK signal pulses. When its count reaches WHOLE, counter 68 generates a next BOC pulse. The leading edge of the BOC pulse tells pattern generator 46 of FIG. 2 to produce a new PSET value, thereby causing RAM 66 to produce a WHOLE/FRACTION data pair for the next test cycle. Accumulator 70 accumulates successive FRACTION data values to produce the CVRN data. Accumulator 70 overflows when the accumulated CVRN data indicates a period greater than one MCLK cycle and provides an overflow signal OF to a +1 input of counter 68. When counter 68 next loads a WHOLE value it sets its count limit to WHOLE+1. Thus the BOC output of counter 68 indicates a last MCLK pulse preceding a start of a next test cycle while the CVRN data indicates a fractional portion of one MCLK cycle after that MCLK pulse that the next test cycle actually begins.

Tester Channel

Figure 5:
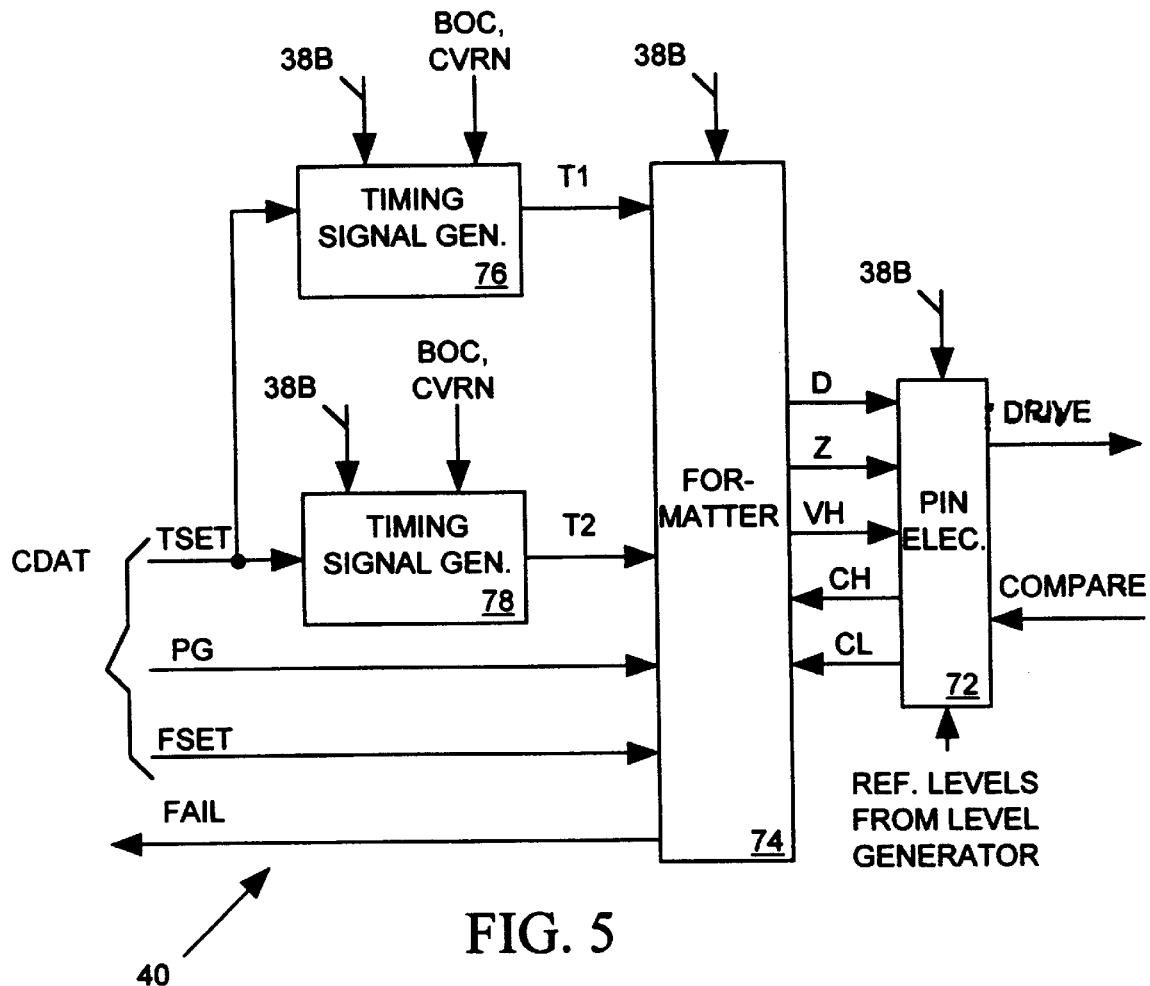
FIG. 5 illustrates a typical tester channels of FIG. 2 in more detailed block diagram form.

FIG. 5 illustrates tester channel 40(1) of FIG. 2 in more detailed block diagram form. Channels 40(2)–40(48) are similar. The channel data CDAT pattern generator 46 of FIG. 2 supplies to each channel 40(1)–40(48) for each test cycle includes format set data (FSET), time set data (TSET), and reference data (PG). The FSET data references a particular drive or compare format the channel is to use during the cycle. A "drive format" is a particular manner in which the channel controls the states of its output test signal during the test cycle. A drive format includes the manner in which the channel acquires data that determines successive test signal states during the test cycle and the manner in which the channel times test signal state changes. A "compare format" is a particular manner in which the channel determines whether the DUT output signal is behaving as expected during the test cycle. A compare format includes the manner in which the channel determines the expected states of the output signal and the manner in which the channel compares the output signal to its expected states and produces the FAIL signal. The TSET data indicates certain times during a test cycle at which an event is to occur, such as for example, a test signal state change or a DUT output signal comparison.

Tester channel 40(1) includes a pin electronics circuit 72 for supplying the test signal to the DUT terminal in response to a set of drive control signals (D, Z and VH). The D control signal tells the pin electronics circuit 72 whether to drive its output test signal (DRIVE) to a high or low logic level. The VH signal tells pin electronic circuit 72 whether to drive the DRIVE signal to a secondary voltage. The Z control signal tells pin electronics circuit 72 when to tristate the DRIVE signal. During each test cycle pin electronics circuit 72 also monitors the DUT output signal COMPARE the DUT terminal and produces compare high and compare low signals (CH and CL) indicating whether the DUT output signal is currently above a high logic level or below a low logic level. Pin electronics circuit 72 uses signals from level generator 56 of FIG. 2 as references when determining the DUT's high and low logic levels.

In addition to pin electronics circuit 72, tester channel 40(1) includes a formatter circuit 74 and two timing signal generators 76 and 78. Each timing signal generator 76 or 78 receives TSET data from pattern generator 20 and the BOC and CVRN signals from period generator 20 at the start of each test cycle and pulses an output timing signal T1 or T2 once during each test cycle with a delay following the start of the test cycle indicated by the TSET data. The BOC and CVRN signals indicate when each test cycle begins.

Formatter circuit 74 receives the FSET data from pattern generator 20 and supplies the drive control signals D, Z and VH to pin electronics circuit 72 causing it to carry out a drive format indicated by the FSET data. When the FSET data references a drive format the PG data may indicate states to which the formatter is to set the drive control signals and the timing signals T1 and T2 indicate tell formatter circuit 74 when to adjust states of drive control signals D, Z and VH. When the FSET data references a compare format, formatter circuit 74 samples the compare high CH and CL outputs of the pin electronics circuit at times indicated by the T1 and/or T2 timing signals and determines therefrom whether to assert the FAIL signal during the test cycle. In some compare formats the PG data references expected states of the CH and CL data.

When it executes its setup instructions before the start of a digital logic test, microcontroller 30 of FIG. 2 writes control data into timing signal generators 76 and 78 and formatter 74 via bus 38B. The control data supplied to timing generators 76 and 78 relates a particular T1 and T2 timing signal pulse delay to each possible value of TSET. The programming data supplied to the formatter 74 of each channel relates a particular drive and control format to each possible combination of FSET and PG data.

Formatter

Figure 6:
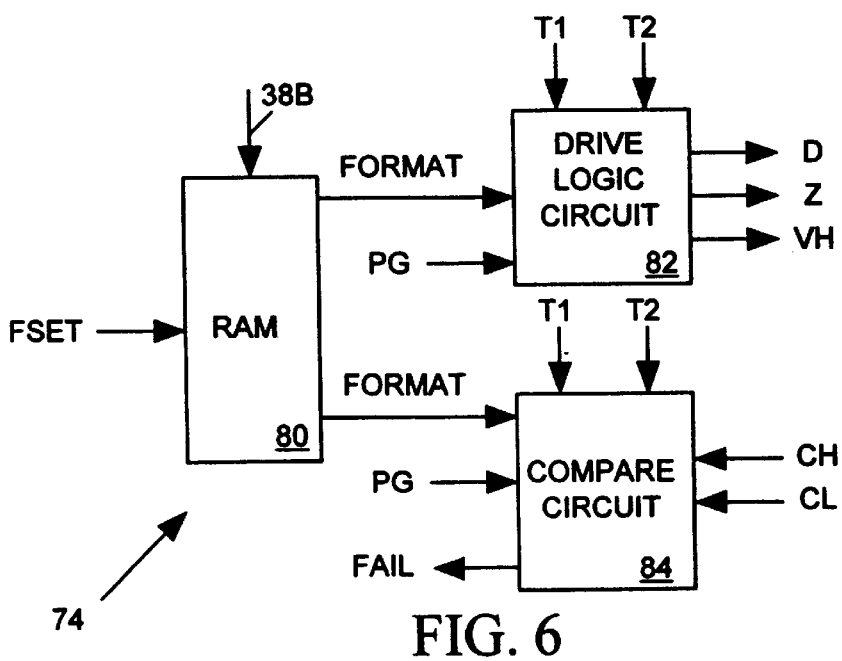
FIG. 6 illustrates the formatter of FIG. 5 in more detailed block diagram form.

FIG. 6 illustrates formatter 74 of FIG. 5 in more detailed block diagram form. Referring to FIG. 6, formatter 74 receives a 4-bit FSET data value from pattern generator 46 of FIG. 2 for each main test cycle. The FSET data indicates a particular test format to be carried out by a tester channel at the DUT terminal during the test cycle. The 4-bit FSET data value addresses a RAM 80, having 16 storage locations, one for each value of the FSET data. Before the test begins, instructor microcontroller 30 of FIG. 2 writes format control data (FORMAT) in each storage location of RAM 80 via bus 38B. Although each channel is capable of executing a large number of different types of test formats, the FSET data value supplied to the formatter 74 has only four bits and can only take on 16 different values. Thus the FSET data value can only represent 16 of the large number of different test formats formatter 74 can produce. The data stored in the 16 storage locations of RAM 80 determines which 16 of the many possible test formats channel 74 will be able to perform during the test. Since instruction controller 30 may write different control data into the RAM 80 of the formatter 74 of each tester channel 40(1)–40(48) of FIG. 2, the tester channels do not all have to be programmed for the same 16 formats.

During a test, when an incoming FSET data value addresses RAM 80, RAM 80 reads out a portion of the addressed FORMAT data to a drive logic circuit 82 and reads out another portion of the addressed FORMAT data to a compare logic circuit 84. The drive logic circuit 82 also receives the T1 and T2 timing signals from the timing generator 18 of FIG. 1 and the reference data bits PG of the channel data CDAT from pattern generator 46 of FIG. 2. Drive logic circuit 82 supplies the output D, Z and VH signals to pin electronics circuit 72 of FIG. 5 with the particular sequence of state changes in the D, Z and VH signals being controlled by the FORMAT data and with the timing of those state changes being controlled by the T1 and T2 timing signals. In some drive formats bits of the PG data indicate states to which the D, Z and/or VH signals are to be driven. In other drive formats, the new states of the D, Z and/or VH signals are specified by the format itself and are independent of the PG data.

The compare logic circuit 84 also receives the T1 and T2 timing signals and PG data as well as the compare high (CH) and compare low (CL) output signals of pin electronics circuit 72 of FIG. 5. The compare logic circuit 84 compares the CH and/or CL signals to their expected states and asserts the MOD_FAIL signal when the CH and CL signal states are not as expected during a test cycle. The FORMAT data controls the manner (format) in which compare logic circuit 84 carries out the comparison. The FORMAT data input to compare logic circuit selects the timing T1 and/or T2 timing signal that will control the timing of the comparison. In some compare formats the two-bit reference data PG indicates expected states CH and CL signal states. In other compare formats, the expected states are specified by the format itself and are independent of the PG data.

Leakage Current Measurement and Pass/Fail Tests

Figure 7:
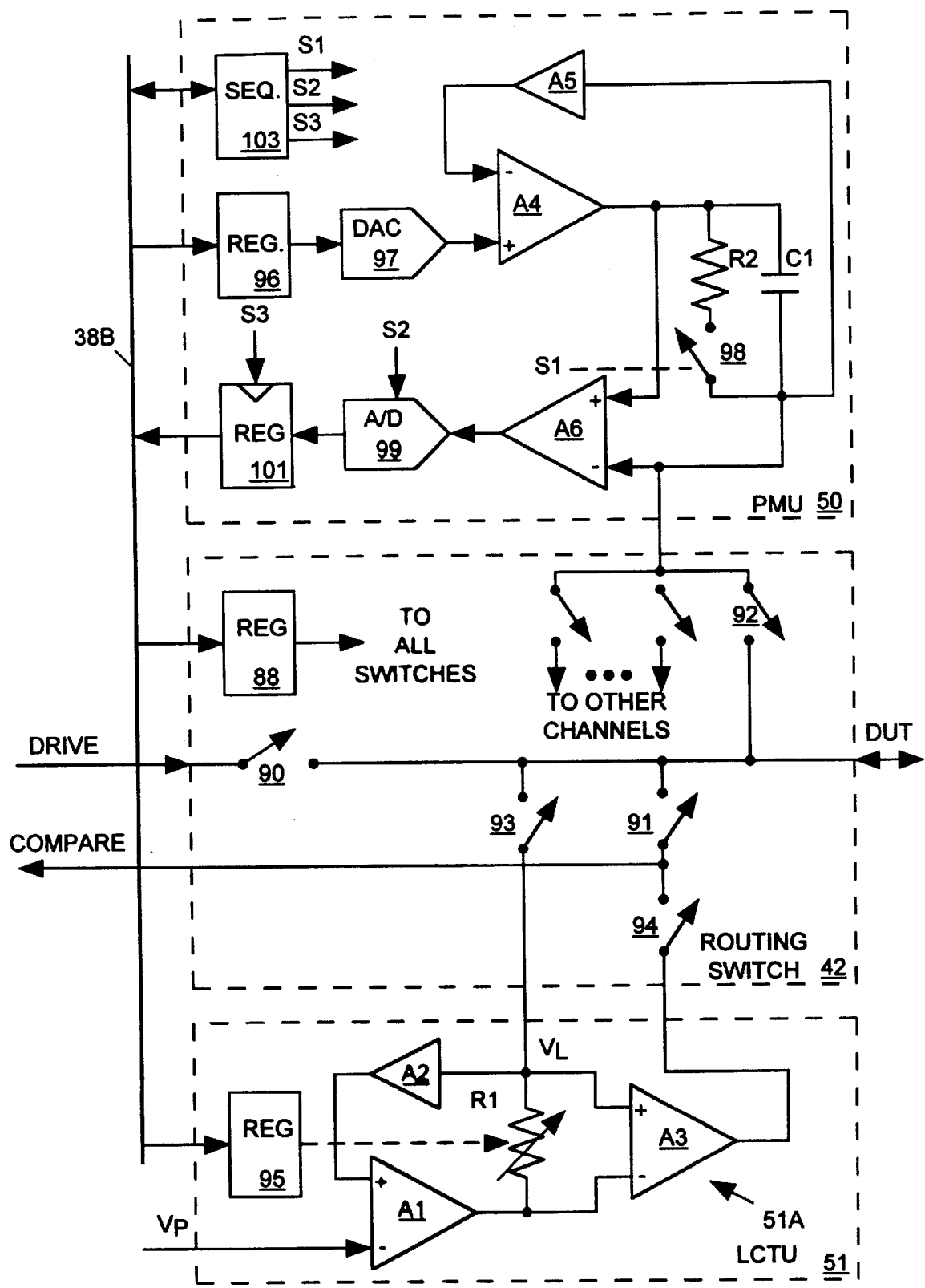
FIG. 7 illustrates the parametric measurement unit (PMU), the leakage current test unit (LCTU) and the routing switch of FIG. 2 in more detailed block diagram form.

FIG. 7 illustrates PMU 50, LCTU 51, switch controller 52 and routing switch 42 of FIG. 2 in more detailed block diagram form. Routing switch 42 selectively interconnects tester channels 40(1)–40(48), PMU 50 and LCTU 51 to the various DUT terminals. Switch positions are controlled by bits of control data microcontroller 30 of FIG. 2 writes into a register 88 of switch controller 52 during the set up process. During a digital logic test, a switch 90 is closed to connect the DRIVE signal output of the pin electronics circuit 72 (FIG. 5) of one of tester channels 40(1)–40(48) of FIG. 2 to the DUT terminal. A switch 91 is closed to provide the DUT output signal as the COMPARE signal input to pin electronics circuit 72 of FIG. 5. Switches 92, 93, and 94 are open to isolate PMU 50 and LCTU 51 from the DUT terminal.

LCTU 51 includes 48 voltage source circuits, each for providing a test voltage to a separate DUT terminal via routing switch 42 during a leakage current pass/fail test. Only one such voltage source circuit 51A is shown in FIG. 7. During the leakage current pass/fail test switches 90, 91 and 92 are open. Switch 93 is closed to permit an amplifier A1 within LCTU 51 to apply a test voltage $V_L$ to the DUT terminal through a variable resistor R1. Current into or out of the DUT terminal produces a voltage across resistor R1. An amplifier A3 in LCTU 51 amplifies the voltage developed across resistor R1 and supplies it via closed switch 94 as the COMPARE signal input to pin electronic circuit 72 (FIG. 5) of one of channels 40(1)–40(48). The channel 40(1)–40(48) asserts its FAIL signal if the voltage of the COMPARE signal is above predetermined threshold value, indicating that the current at the DUT terminal is outside a specified range. A reference voltage $V_P$ from level generator 51 of FIG. 2 indicating the desired level of $V_L$ is supplied to one input of differential amplifier A1. A unity gain amplifier A2 feeds $V_L$ back to the other input of amplifier A1. The feedback provided by amplifier A2 causes amplifier A1 to maintain $V_L$ at the desired test voltage $V_P$ regardless of the amount of leakage current through the DUT terminal. A register 95 stores set up data from microcontroller 30 of FIG. 2 for controlling the value of R1 during the test.

During a parametric leakage current measurement test, PMU 50 is connected through switch 92 to one of the DUT terminals to measure its leakage current. Switches 90, 91, 93 and 94 are held open. In the parametric test, a specified voltage at which the leakage current is to be measured is forced onto a DUT terminal and the resulting leakage current flow into or out of the DUT terminal is measured. Parametric tester 50 includes an addressable register 96 for storing control data provided by microcontroller 30 of FIG. 2 via bus 38B during system set up. The data value stored in register 96 drives a digital-to-analog converter (DAC) 97 providing a reference voltage to a differential amplifier A4. Amplifier A4 produces a voltage at the DUT terminal through a resistor R2 and switch 98 in parallel with a capacitor C1. With the voltage at the DUT terminal fed back to an input of amplifier A4 via a unity gain amplifier A5, amplifier A4 maintains the DUT terminal voltage at the level indicated by the output of DAC 97. An amplifier A6 amplifies the voltage developed across R2 to provide an input to a analog-to-digital (A/D) converter 99. A/D converter 99 digitizes the output of amplifier A6 and supplies it to a register 101 read accessed by microcontroller 30 of FIG. 2 via bus 38. During the test, a sequencer 103 produces output control signals S1 and S2 for controlling switch 98 and register 101.

After storing data in register 88 of switch controller 52 to connect PMU 50 to a desired DUT terminal via switch 92, microcontroller 30 of FIG. 2 signals sequencer 103 via bus 38. Sequencer 103 asserts the S1 signal to close switch 98, thereby discharging capacitor C1 and allowing amplifier A4 to drive the DUT terminal to the test voltage. Sequencer 103 then deasserts S1 to open switch 98, allowing leakage current at the DUT terminal to charge capacitor C1. Amplifier A6 amplifies the voltage across C1. After a predetermined time, sequencer 103 briefly asserts an output signal S2 causing a A/D converter 99 to sample and convert the output of amplifier A6 to a digital quantity supplied to the input of a register 101. An output signal S3 of sequencer 103 tells register 101 to store the data output of A/D converter 99. Sequencer 103 then sends an end of test message to microcontroller 30 via bus 38B. Microcontroller 30 may later read the data out of register 101 via bus 38B and send it to host 16 of FIG. 1 with its end of test message. Host 16 can compute the leakage current from the data read out of register 101 since it is proportional to the sampled output voltage of amplifier A6 divided by the time C1 was allowed to charge, the interval between the time sequencer 103 turns off S1 and the time it pulses S2.

Tester Programming Example

Figure 8:
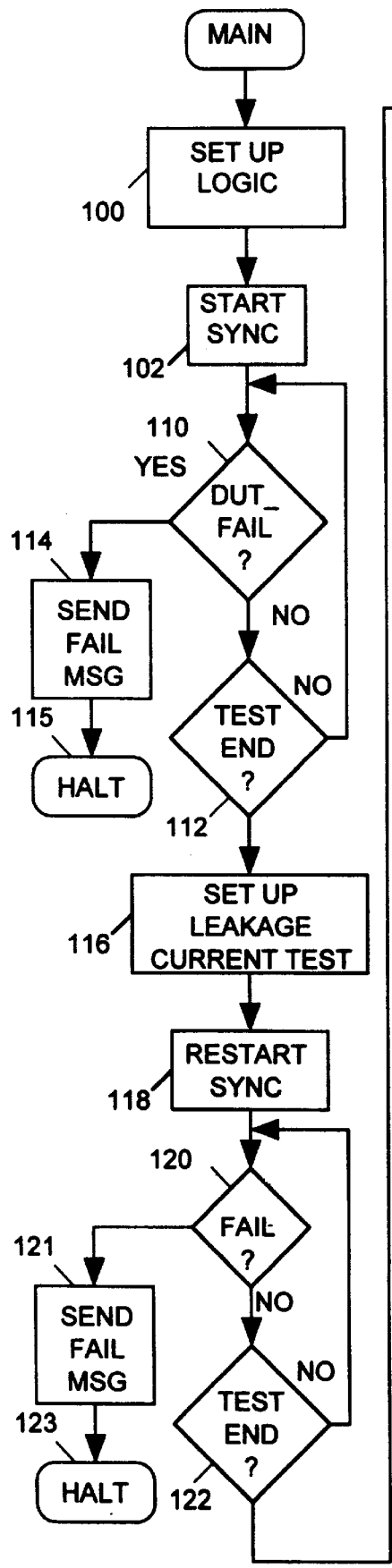
FIG. 8 is a flow chart of a typical main program that the host computer of FIG. 1 may supply to a tester of FIG. 1.
Figure 9:
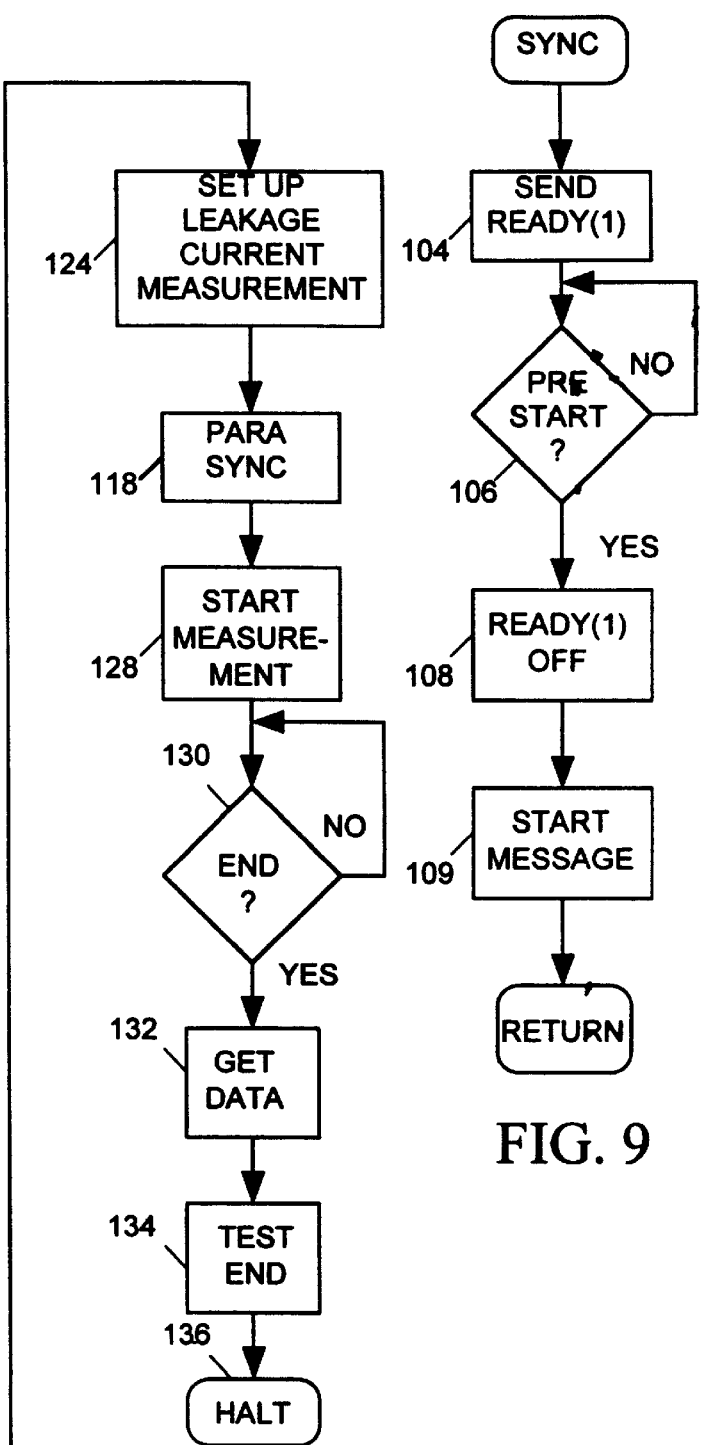
FIG. 9 is a flow chart illustrating a SYNC subroutine called by the main routine of FIG. 8.

FIG. 8 is a flow chart of an example main program that host computer 16 of FIG. 1 may supply to tester module 14(1) of FIG. 2 via network 18. FIG. 9 is a flow chart illustrating a START SYNC subroutine the main routine of FIG. 8 calls to synchronize operations of module 14(1) to other modules of tester 10 of FIG. 1. Microcontroller 30 of FIG. 2 stores the main program in RAM 34 along with all of the various subroutines and data files provided by host 16 of FIG. 1. When host 16 sends a start message to microcontroller 30 via network 18, the microcontroller begins executing the main program starting at a RAM 34 address included in the start message.

In the example illustrated in FIG. 8, tester module 14(1) is to perform in succession a digital logic test, a leakage current pass/fail test, and a parametric leakage current measurement test. At step 100, local microcontroller 30 of FIG. 2 executes the setup instructions for the digital logic test. The instructions from host 16 include a set up data file for each test listing all of the data values that are to be stored in the various memories and registers within the various module components along with the memory or register address at which each data value is to be stored. At step 100 microcontroller 30 writes all of that data from the set up file for the first test to the appropriate addresses via buses 38A/38B. This data includes data for programming start and fail logic circuits 20 and 24, data to be written into RAMs within period generator 44, pattern generator 46 and tester channels 40(1)–40(48), and parameter control data to be written into registers within PMU 50, device power supply 54 54 and level generator 56, and switch configuration data to be written into registers in switch controller 52.

After writing the set up data for the first test to the various module components, microcontroller 30 executes the START SYNC subroutine 102 illustrated in FIG. 9. Referring to FIG. 9, microcontroller 30, having completed setting up module 14(1) to perform the digital logic test, first asserts the READY(1) signal of FIG. 2 (step 104) to indicate that module 14(1) is ready to perform the digital logic test. Microcontroller 30 then waits for the PRESTART signal output of start logic circuit 20 of FIG. 2 (step 106) indicating that the other modules involved in the test are also ready to perform the test, and then de-asserts the READY(1) signal (step 108). Microcontroller 30 then sends a start message to pattern generator 46 of FIG. 2 telling it to begin the test (step 109).

The SYNC routine of FIG. 9 is encoded into microcontroller 30 of each module so that it does not have to access RAM 34 or ROM 36. Since all microcontroller 30 are clocked by the MCLK signal, the steps of the SYNC routine are carried out synchronously. Therefore the pattern generators 46 of all modules receive their start messages at the same time and read out the PSET/CDAT for the first test cycle at the same time. This causes tester channels 40(1)–40(48) of all modules 14 to thereafter start the first test cycle concurrently.

Referring again to FIG. 8, after executing the START SYNC routine, microcontroller 30 waits (step 110) either until it receives a DUT_FAIL message of from pattern generator 46 indicating that one of modules 14 of FIG. 1 has detected a DUT failure and has asserted a FAIL signal, or until it receives a test end message from pattern generator 46 of FIG. 2 indicating that the DUT test has been successfully completed (step 112). Upon receiving a DUT_FAIL message, microcontroller 30 sends a DUT fail message to host computer 16 of FIG. 1 (step 114) and then halts microcontroller operation (step 115) until the microcontroller receives another message from the host.

If pattern generator 46 of FIG. 2 sends a test end message to microcontroller 30 at step 112 indicating the logic test of the DUT is successful, then microcontroller 30 sends set up data to tester channels 40(1)–40(48), period generator 44, switch controller 52, power supply 54 and level generator 56 of FIG. 2 to prepare these components to carry out the leakage current pass/fail test (step 116). In this example it is assumed that program memory 60 and pattern memory 62 of pattern generator 46 of FIG. 3 are large enough to hold all data for both the digital logic test and the the leakage current pass/fail test and that microcontroller 30 wrote that data for both tests into those memories when setting up the module for the digital logic test.

After stetting up the module for the leakage current pass/fail test, the main routine calls a RESTART SYNC subroutine (step 118) that is similar to the START SYNC subroutine of FIG. 9 except that a restart message rather than a start message is sent to the pattern generator at step 109. The restart message tells pattern generator instruction processor 64 of FIG. 3 to resume addressing program memory 60 at the address following the address containing the last instruction for the digital logic test. That is where the first instruction of the leakage current test is stored.

Microcontroller 30 again waits for either a DUT_FAIL message (step 120) or for a test end message (step 122) from pattern generator 46. On receiving a DUT_FAIL message from the pattern generator, microcontroller 30 sends a DUT fail message to host 16 (step 121) and then halts and waits for a next message from the host (step 123). If pattern generator 46 of FIG. 2 sends the test end message at step 122 indicating that the DUT leakage current pass/fail test was successful, microcontroller 30 sends set up data to PMU 50, switch controller 52, and level generator 56 of FIG. 2 to prepare the module for the parametric leakage current measurement test (step 124). It then executes a PARA SYNC routine (step 126) which is similar to the START SYNC routine of FIG. 9 except that at step 109, microcontroller 30 a start message to sequencer 103 of PMU 50 of FIG. 7 telling it to begin the leakage current measurement test. Microcontroller 30 then waits (step 130) for PMU 50 to return an END message indicating that the test is complete. Thereafter microcontroller 30 reads the data representing the magnitude of the leakage current out of register 101 of PMU 50 of FIG. 7 (step 132) and sends a test end message to the host conveying the leakage current data (step 134). Microcontroller 30 then halts and waits for a message from the host telling it what to do next.

Thus has been shown and described a modular integrated circuit tester 10 including a set of tester modules 14 that can be programmed to automatically reconfigure and re-synchronize themselves before each test of a sequence of tests to be performed on a DUT without intervention from a host controller. The tester architecture allows modules 14 to be organized into independent working groups which can test differing types of DUTs concurrently and which can be physically separated from one another and from the host by considerable distance. While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A modular integrated circuit tester for testing an integrated circuit device under test (DUT) having a plurality of terminals, the tester comprising:

network means for conveying instructions;

a host computer connected to said network means for transmitting a plurality of instruction sets via said network means; and a plurality of tester modules connected to said network means for receiving a corresponding one of said instruction sets transmitted by said host computer, and concurrently connected to said DUT for concurrently carrying out test activities at said DUT terminals, each tester module comprising:

bus means, memory means connected to said bus means for storing the received instruction set, a pattern generator, connected to said bus means for receiving and storing pattern control data via said bus means, and for thereafter generating channel control data in response to the stored pattern control data, controller means connected to said bus means for reading the received instruction set out of said memory means via said bus means and for executing said instruction set, said instruction set instructing said controller means to provide said pattern control data to said pattern generator via said bus means, and a plurality of tester channels connected to said pattern generator for receiving channel control data generated by said pattern generator, each tester channel being connected to a terminal of said DUT for performing test activities at said terminal in response to the channel control data.

2. The modular integrated circuit tester in accordance with claim 1 wherein each tester module further comprises start logic means for sending a PRESTART signal to the controller means of said tester module in response to a logical combination of input READY signals, wherein said instruction set executed by the controller means of each tester module instructs said controller means to send a READY signal to the start logic means of each tester module after providing said pattern control data to the pattern generator, wherein the pattern generator of each tester module begins generating said channel control data upon receipt of a start message, and wherein the controller means of each module sends said start message to the pattern generator of said module in response to said PRESTART signal.

3. The modular integrated circuit tester in accordance with claim 2 wherein said logical combination of READY signals is determined by programming data provided as input to said start logic means.

4. The modular integrated circuit tester in accordance with claim 3 wherein said host computer provides said programming data as input to said start logic means via said network means.

5. The modular integrated circuit tester in accordance with claim 1 wherein said network means conveys said instruction sets from said host computer to said tester modules as serial data transmissions.

6. The modular integrated circuit tester in accordance with claim 1 wherein each tester module further comprises fail logic means for generating a DUT fail signal in response to logical combinations of a set of input module fail signals, wherein each tester module further comprises means for generating one of said module fail signals in response to a set of channel fail signals, and wherein test activities performed by any one of said tester channels include monitoring a DUT output signal produced at the DUT terminal to which it is connected and generating one of said channel fail signals when the output signal is of an unexpected state.

7. The modular integrated circuit tester in accordance with claim 6 wherein the instruction set stored in the memory means of each tester module includes a routine that is executed by the controller means upon receiving said DUT fail signal from said fail logic means.

8. The modular integrated circuit tester in accordance with claim 1 wherein each tester module further comprises:

start logic means for sending a PRESTART signal to the controller means of said tester module in response to a logical combination of input READY signals, wherein the instruction set executed by the controller means of each tester module instructs said controller means to send a READY signal to the start logic means of each tester module after providing said pattern control data to the pattern generator, wherein the pattern generator of each tester module begins generating said channel control data upon receipt of a start message, and wherein the controller means of each module sends said start message to the generator of said module in response to said PRESTART signal, and fail logic means for generating a DUT fail signal in response to logical combinations of a set of input module fail signals, wherein each tester module further comprises means for generating one of said module fail signals in response to a set of channel fail signals, and wherein test activities performed by any one of said tester channels include monitoring a DUT output signal produced at the DUT terminal to which it is connected and generating one of said channel fail signals when the output signal is of an unexpected state.

9. The modular integrated circuit tester in accordance with claim 8 wherein said logical combinations are determined by programming data provided as input to said start logic means and said fail logic means via said network means.

10. The modular integrated circuit tester in accordance with claim 9 wherein said host computer provides said programming data as input to said start logic means and said fail logic means.

11. A modular integrated circuit tester for performing a sequence of tests on an integrated circuit device under test (DUT) having a plurality of terminals, the tester comprising a plurality of tester modules, concurrently connected to said DUT for concurrently carrying out test activities at said DUT terminals, each tester module comprising:

start logic means for generating a start message in response to a logical combination of input READY signals; and testing means for receiving a control data set defining a sequence of test actions to be taken at at least one DUT terminal during a test, for receiving said start message generated by said start logic means, and for performing in response to said start message the sequence of test activities defined by the received control data, memory means for storing instructions, and controller means for executing the instructions stored in said memory means, the instructions instructing said controller means to provide in succession a separate set of control data for each of said tests, each control data set defining a sequence of test actions to be taken at said at least one DUT terminal, and for providing one of said READY signals to the start logic means of each of said plurality of tester modules after providing each control data set to testing means.

12. The modular integrated circuit tester in accordance with claim 11 wherein each of said plurality of tester modules further comprises:

fail logic means for generating a DUT fail signal in response to logical combinations of a set of input module fail signals, and means for generating one of said module fail signals in response to a set of channel fail signals, wherein test activities performed by any one of said tester modules include monitoring a DUT output signal produced at the DUT terminal to which it is connected and generating one of said channel fail signals when the output signal is of an unexpected state.

13. The modular integrated circuit tester in accordance with claim 12 wherein the instructions stored in the memory means of each tester module includes a routine that is executed by the controller means upon receiving said DUT fail signal from said fail logic means.

* * * * *